(12) United States Patent
Mastromatteo et al.

(10) Patent No.: US 7,463,454 B2
(45) Date of Patent: Dec. 9, 2008

(54) MICRO-ACTUATOR FOR HARD DRIVE UTILIZING INSULATING PORTIONS TO SEPARATE BIASING REGIONS FROM ADJACENT REGIONS OF THE MICRO-ACTUATOR AND SIMPLIFIED MANUFACTURE PROCESS THEREFORE

(75) Inventors: Ubaldo Mastromatteo, Bareggio (IT); Bruno Murari, Monza (IT); Paolo Ferrari, Gallarate (IT); Simone Sassolini, Sansepoi Cro (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 11/818,659

(22) Filed: Jun. 14, 2007

(65) Prior Publication Data

US 2007/0247761 A1 Oct. 25, 2007

Related U.S. Application Data

(62) Division of application No. 10/601,332, filed on Jun. 20, 2003, now Pat. No. 7,239,487.

(30) Foreign Application Priority Data

Jun. 20, 2002 (EP) .................................. 02425407

(51) Int. Cl.
*G11B 5/56* (2006.01)
(52) U.S. Cl. ............................... 360/294.2; 310/40 MM
(58) Field of Classification Search ... 360/294.1–294.6; 310/40 MM
See application file for complete search history.

(56) References Cited

U.S. PATENT DOCUMENTS 5,233,213 A 8/1993 Marek
6,121,552 A 9/2000 Brosnihan et al.
6,178,069 B1 * 1/2001 Suzuki ..................... 360/294.5
6,308,573 B1 * 10/2001 Lee et al. ...................... 73/652
6,404,599 B1 6/2002 Vigna
6,504,685 B1 * 1/2003 Wachtler et al. ......... 360/294.3

(Continued)

FOREIGN PATENT DOCUMENTS

DE 100 03 066 8/2000

(Continued)

OTHER PUBLICATIONS

European Search Report for EP 02 42 5407 dated Nov. 25, 2002.

*Primary Examiner*—A. J. Heinz
(74) *Attorney, Agent, or Firm*—Lisa K. Jorgenson; Bryan A. Santarelli; Graybeal Jackson LLP

(57) ABSTRACT

A micro-electro-mechanical device formed by a body of semiconductor material having a thickness and defining a mobile part and a fixed part. The mobile part is formed by a mobile platform, supporting arms extending from the mobile platform to the fixed part, and by mobile electrodes fixed to the mobile platform. The fixed part has fixed electrodes facing the mobile electrodes, a first biasing region fixed to the fixed electrodes, a second biasing region fixed to the supporting arms, and an insulation region of insulating material extending through the entire thickness of the body. The insulation region insulates electrically at least one between the first and the second biasing regions from the rest of the fixed part.

24 Claims, 5 Drawing Sheets

U.S. PATENT DOCUMENTS

| | | |
|---|---|---|
| 6,587,312 B2 | 7/2003 | Murari et al. |
| 6,590,747 B1 | 7/2003 | Boutaghou et al. |
| 6,624,981 B1 | 9/2003 | Vigna |
| 6,683,757 B1 | 1/2004 | Bonin et al. |
| 6,731,471 B1 | 5/2004 | Bonin |
| 6,798,609 B1 | 9/2004 | Bonin et al. |
| 6,809,907 B1 | 10/2004 | Vigna et al. |
| 6,905,614 B1 | 6/2005 | Novotny |
| 6,973,829 B2 | 12/2005 | Sakai et al. |

FOREIGN PATENT DOCUMENTS

| | | |
|---|---|---|
| DE | 100 03 066 A1 | 8/2000 |
| EP | 1 151 962 A1 | 11/2001 |
| JP | 11-248733 | 9/1999 |
| JP | 11248733 | 9/1999 |

\* cited by examiner

MICRO-ACTUATOR FOR HARD DRIVE UTILIZING INSULATING PORTIONS TO SEPARATE BIASING REGIONS FROM ADJACENT REGIONS OF THE MICRO-ACTUATOR AND SIMPLIFIED MANUFACTURE PROCESS THEREFORE

CROSS-REFERENCE TO RELATED APPLICATION

This is a divisional application that claims priority from European Patent Application No. 02425407.0, filed Jun. 20, 2002, and U.S. patent application Ser. No. 10/601,332, filed Jun. 20, 2003, now U.S. Pat. No. 7,239,487 which are incorporated herein by reference.

PRIORITY CLAIM

This application claims priority from European patent application No. 02425407.0, filed Jun. 20, 2002, which is incorporated herein by reference.

TECHNICAL FIELD

The present invention relates generally to a micro-electro-mechanical device, in particular a micro-actuator for a hard-disk drive, and a manufacturing process thereof.

BACKGROUND

Various processes are known for manufacturing micro-electro-mechanical structures, such as micro motors or micro-actuators that can be used for fine position control of reading and writing heads in hard-disk drives.

In particular, in more recent times, to prevent burdensome steps for removing buried sacrificial layers, it has been proposed to use two distinct semiconductor wafers: a first wafer is designed to house the microstructures, while a second wafer operates as a support for the microstructures and integrates the control circuits of the microstructures.

EP-A-1 151 962, which is incorporated by reference describes a manufacturing process of the above-referred type, which uses integrated silicon plugs for electrically connecting the second wafer to the front of the first wafer, on which the electrical interconnections are formed. The rear of the wafer is, instead, fixed to a protective cap, a read/write head or a further wafer.

The above known solution, albeit representing a considerable improvement over previous solutions, is still complex and entails high manufacturing costs.

Therefore, a need has arisen for a micro-electro-mechanical device and the manufacturing process thereof which overcomes the disadvantages referred to above.

SUMMARY

According to an embodiment of the present invention a micro-electro-mechanical device and a manufacturing process thereof are provided.

BRIEF DESCRIPTION OF THE DRAWINGS

For an understanding of the present invention, preferred embodiments are now described, provided purely by way of non-limiting example, with reference to the attached drawings, wherein.

DETAILED DESCRIPTION

Figure 1:
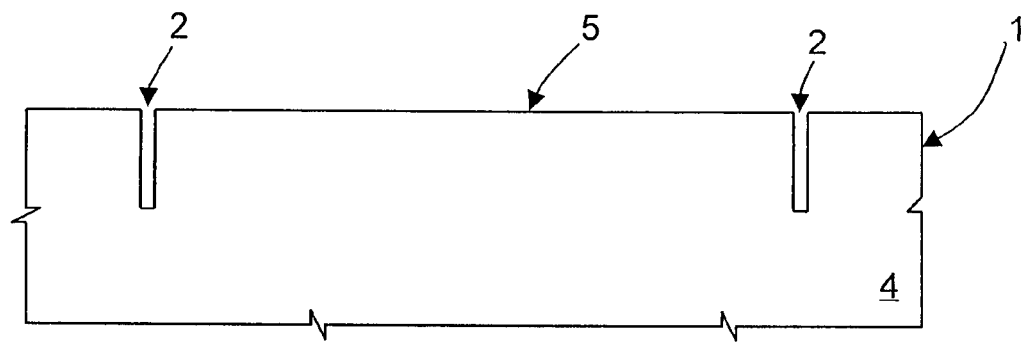
FIG. 1 is a cross-section through a wafer of semiconductor material, during an initial manufacturing step, according to a first embodiment of the invention.
Figure 2:
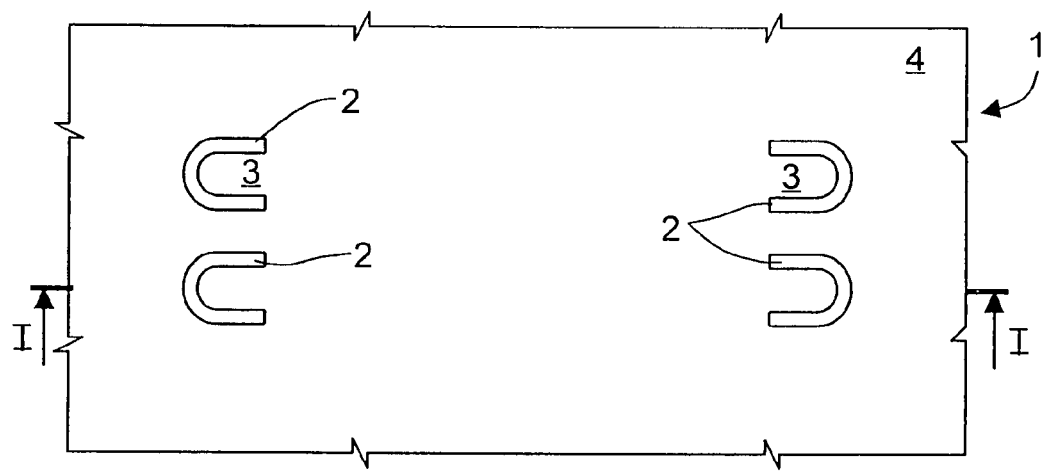
FIG. 2 is a top plan view of the wafer of FIG. 1.

Referring to FIG. 1, according to an embodiment of the invention a first wafer 1 comprising a substrate 4 of semiconductor material, typically heavily doped monocrystalline silicon (for example, an N-type substrate with resistivity of 3 mΩ/cm doped with antimony) having a first surface 5, underwent the steps for making trenches, as described in the above-mentioned patent application EP-A-1 151 962, which was previously incorporated by reference. In particular, the first wafer 1 is masked and etched to form deep trenches 2, here U-shaped, as shown in FIG. 2. The deep trenches 2 surround biasing portions 3 of monocrystalline silicon and have a depth approximately equal to the final depth of wafer 1, for example, 100 µm. Alternately, the deep trenches 2, may completely surround the biasing portions 3 where it is desired to obtain electrical insulation of parts of the first wafer 1.

Figure 3:
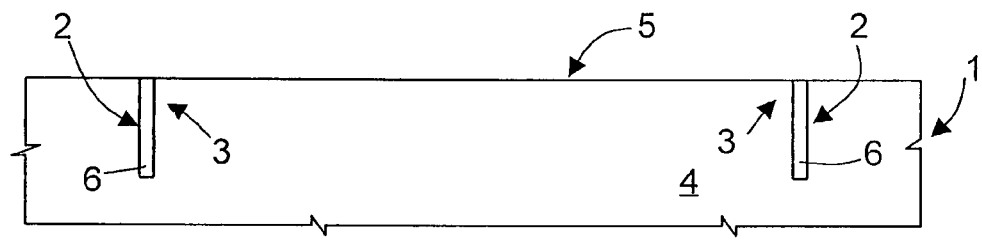
FIGS. 3-9 are cross-sections similar to that of FIG. 1, showing successive manufacturing steps of the wafer according to an embodiment of the invention.

Next, referring to FIG. 3, the trenches 2 are filled, either completely or partially, to form insulating regions 6, for example of silicon dioxide. For this purpose, a silicon dioxide layer is deposited or grown, and is then removed from the first surface 5 of the first wafer 1, for example by chemical-mechanical polishing (CMP).

Figure 4:
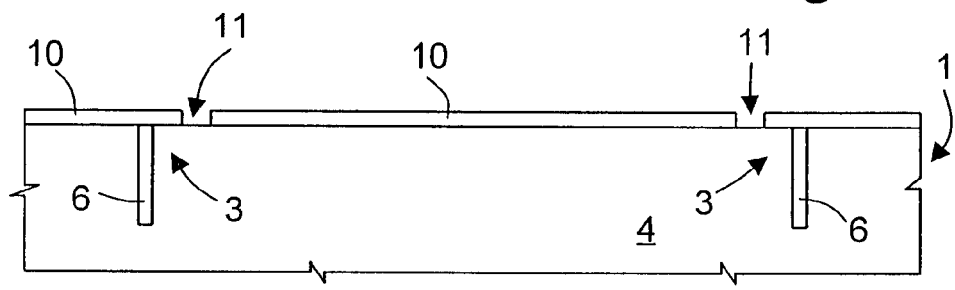

Next referring to FIG. 4, the first surface 5 of the first wafer is coated with an insulating layer 10, for example thermally grown silicon dioxide, and openings 11 are formed for the contacts. The openings are formed above the biasing portions 3 of the substrate 4.

Figure 5:
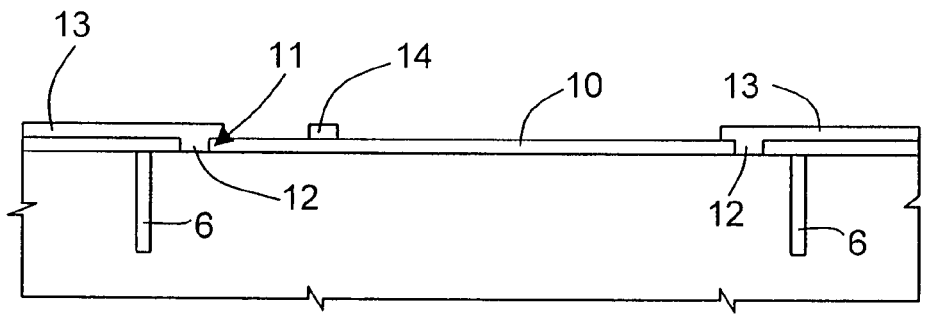

Next, referring to FIG. 5, electrical-connection structures are formed and include contacts 12 extending in the openings 11, electrical-connection lines 13, and contact pads 14 (only one of which can be seen in FIG. 5). The electrical-connection structures, for example of TiNiAu, have a gold finish, to facilitate bonding of the next head.

Figure 6:
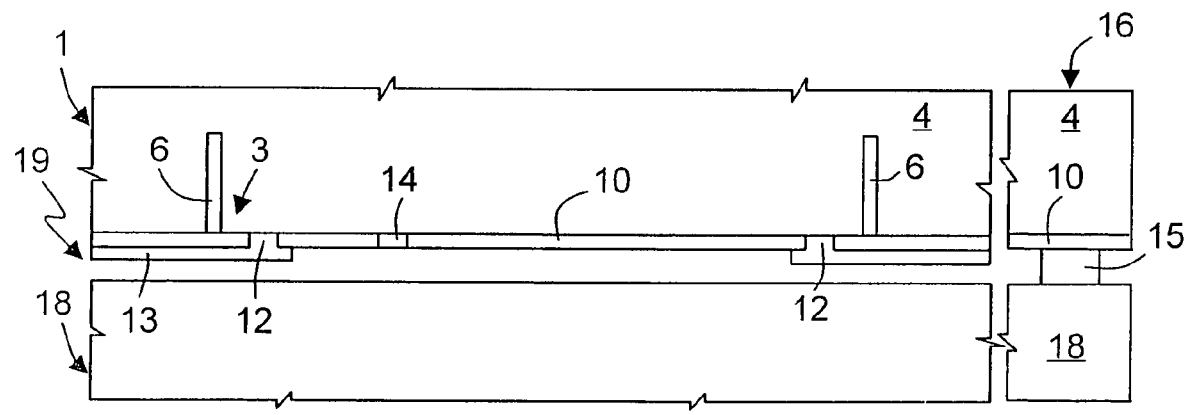

Next, referring to FIG. 6, a second wafer 18 is bonded to the first wafer 1, to obtain a composite wafer 19. In particular, the first wafer 1 is bonded on the side comprising the electrical-connection structures, leaving free the rear of the wafer 1. Bonding is obtained through bonding regions of suitable material. For example, bonding regions 15 of dry resist can be deposited on the front of the wafer and, by masking and etching, be left at scribing lines 16, as shown in FIG. 6. Alignment marks (not shown in FIG. 6) are moreover formed on the rear of the second wafer 18, for subsequent identification of the position of the scribing lines.

Figure 7:
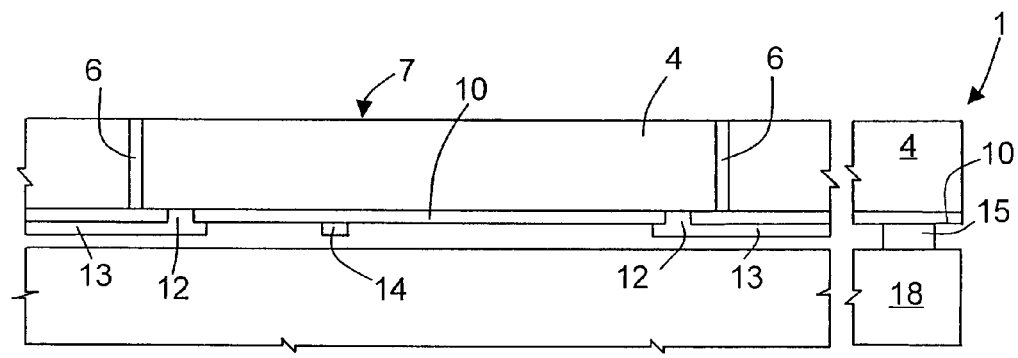

Next referring to FIG. 7, the first wafer 1 is thinned out from the rear mechanically, for example by grinding, until the bottoms of the trenches 2 are reached, preferably until a thickness of approximately 100 µm is obtained. In this way a second surface 7 is formed.

Figure 8:
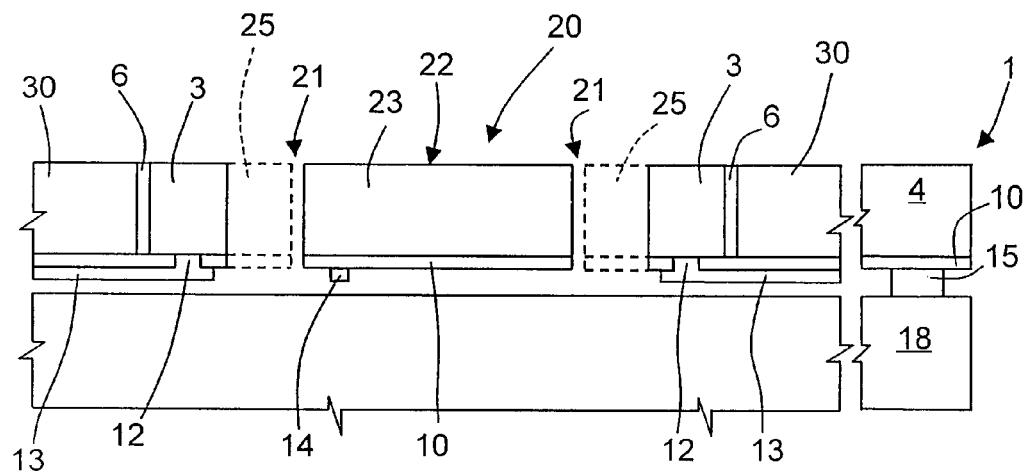
Figure 9:
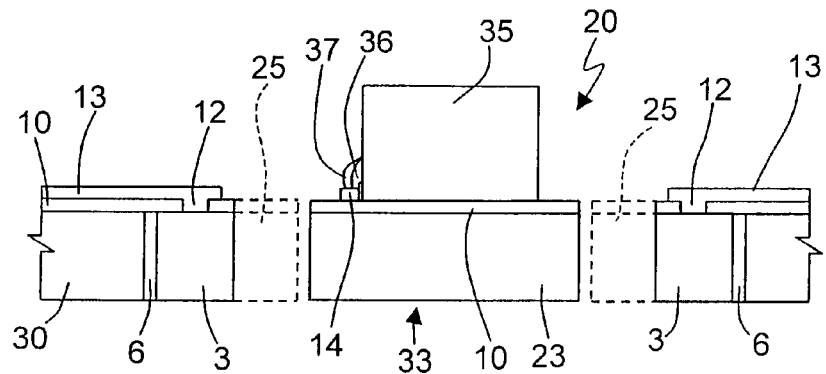
Figure 10:
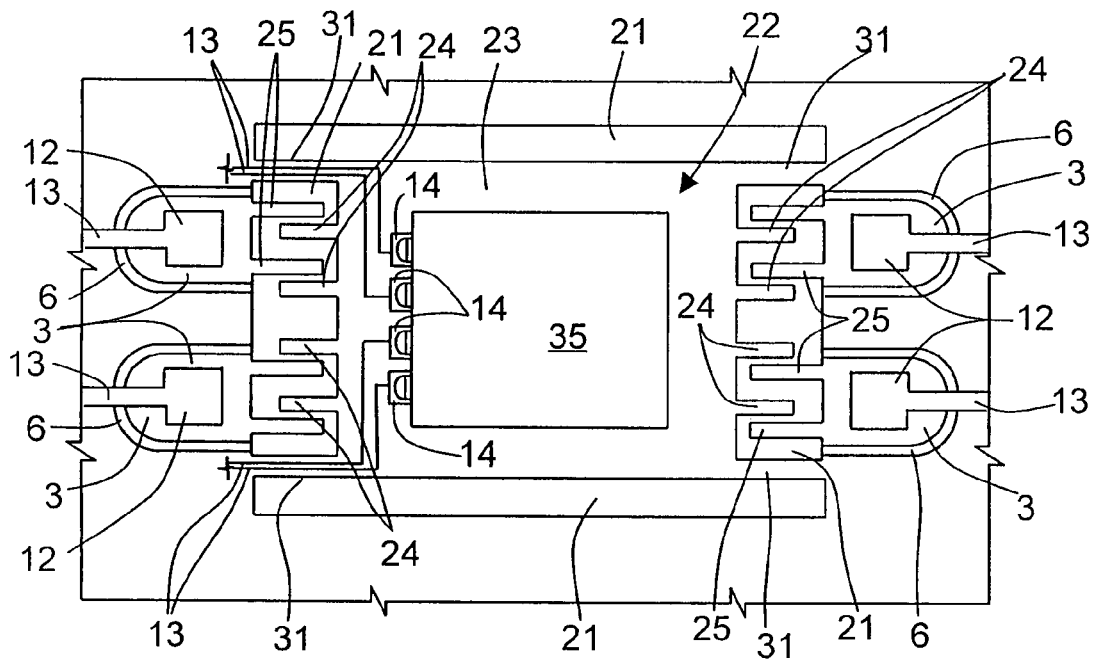
FIG. 10 is a top plan view of the device of FIG. 9.

Referring to FIGS. 8-10, the first wafer 1 is now masked and etched by trench etching starting from the second surface 7 so as to define the desired micromechanical structure, in this case a micro-actuator 20. In one embodiment, second trenches 21 are dug first in the substrate 4 and next in the insulating layer 10 (if it has not been removed previously) so as to separate, from the rest of the substrate 4 (hereinafter referred to also as bulk 30), a mobile region 22 formed by a platform 23 and by a plurality of mobile electrodes 24. The mobile electrodes 24 are comb-fingered with fixed electrodes 25, which extend from the biasing portions 3 of the substrate 4 surrounded by the insulating regions 6. In particular, as a result of the trench etching, the biasing portions 3 are electrically insulated from the bulk 30, since they are delimited by a part of the insulating regions 6 and, towards the platform 23, by a second trench 21.

The platform 23 is connected to the bulk 30 through elastic connection regions (hereinafter defined as springs 31), and the electrical connection lines 13 leading to the contact pads 14 extend above the springs 31.

Referring to FIG. 9, the wafer 1 is cut into dies 33. In this step, the bonding regions 15 are removed, and the dies 33 are separated from the second wafer 18. Then, a ceramic body, referred to as slider 35 and carrying a read/write transducer (not shown), is bonded onto the platform 23 in a per se known manner. In addition, contact pads 36 on the slider 35, in electrical connection with the read/write transducer, are soldered to the contact pads 14 using low-melting material 37.

Figure 11:
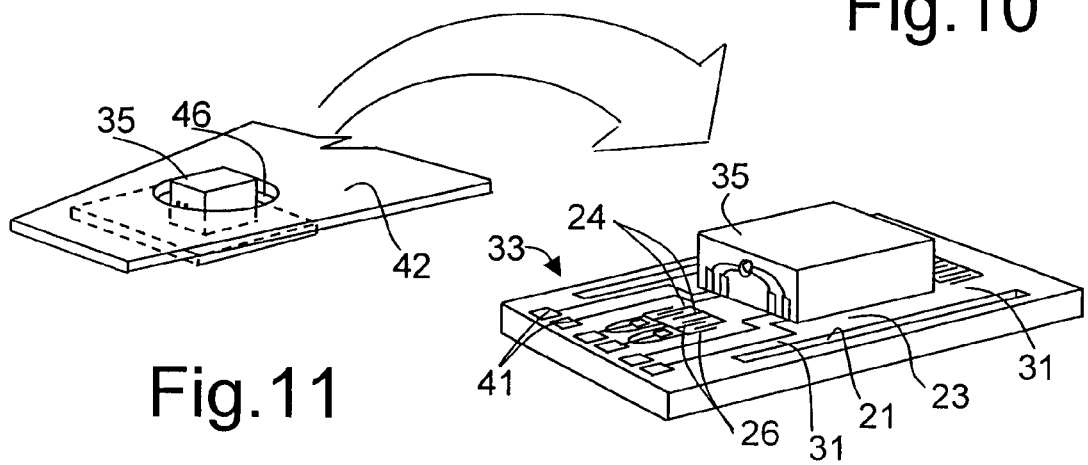
FIG. 11 is a perspective view of a detail for fixing the device of FIG. 9 to a suspension of a hard-disk drive according to an embodiment of the invention.

Referring to FIG. 11, the connection lines 13 can terminate at contact pads 41, which are soldered to respective pads provided on a suspension 42. In the embodiment shown in FIG. 11, the top side of the die 33, which carries the slider 35, is fixed on the rear side of the suspension 42, which is provided with an opening 46, through which the slider 35 can pass (see, for example, EP-A-977 180, which is incorporated by reference). Thereby, the crosswise encumbrance of the suspension/micro-actuator/slider assembly is reduced to a minimum, and the system is particularly suited for meeting the increasingly stringent requirements dictated by the need to reduce space between the disks in hard-disk drives.

Figure 12:
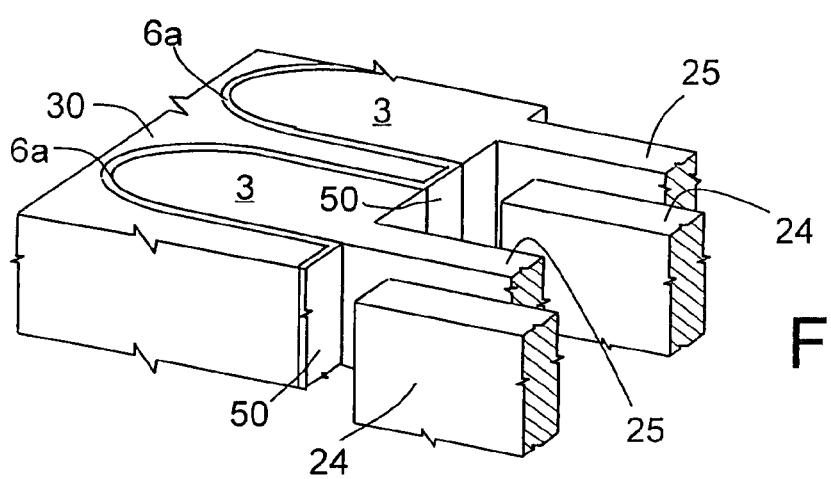
FIG. 12 is a perspective view of a detail of FIG. 9, according to a different embodiment of the invention.

Referring to FIG. 12, in one embodiment, each biasing portion 3 is connected to a single fixed electrode 25; in general, however, the biasing portions 3 can be connected to any number of fixed electrodes 25 that are to be biased at a same potential, according to the existing space and layout requirements.

Still referring to FIG. 12, an insulating region 6 is formed by insulating portions 6a connected together by connecting portions 50 so as to define as a whole a wavy line, the ends of which terminate on a second trench 21 (FIG. 10). In particular, by careful design and alignment of the masks defining the first trenches 2 and the second trenches 21, it is possible to get the connecting portions 50 to extend along the edge of the bulk 30 of the wafer 1, thus separating the biasing portions 3 from one another. This solution can obviously also be applied to the case where each biasing portion 3 is connected to more than one fixed electrode 25.

Figure 13:
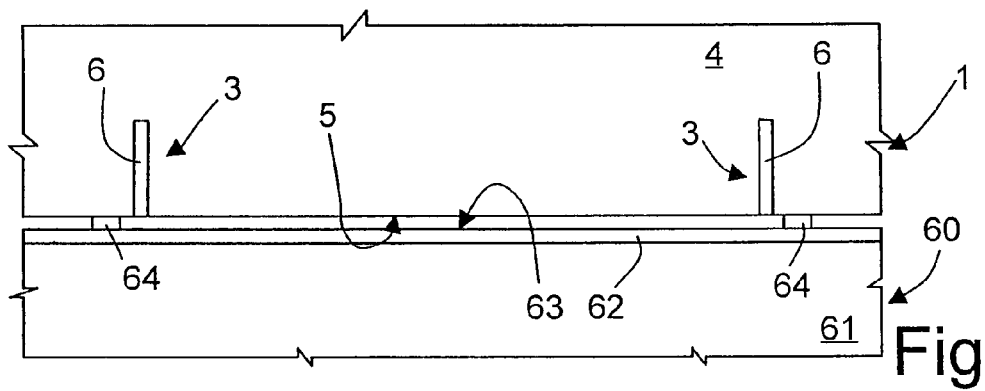
FIGS. 13-16 are cross-sectional views similar to that of FIG. 1, showing successive manufacturing steps of the wafer according to a different embodiment of the invention.

Referring to FIG. 13, and according to a different embodiment of the invention, after forming the first trenches 2 and filling them with the insulating regions 6, the first wafer 1 is bonded to a second wafer 60. The second wafer 60 comprises a silicon substrate 61 and an insulating layer 62, for example of silicon dioxide. On the surface 63 of the second wafer 60, there are provided connecting regions 64, of a metal that is able to react at low temperature with silicon of the first wafer 1 to form a gold/silicon eutectic or a metallic silicide. Typically, the connecting regions 64 are of palladium, so as to form a silicide; alternatively, the connecting regions 64 can be of gold, when it is desired to obtain a eutectic. Next, the first wafer 1 is turned upside down so as to turn the first surface 5 towards the second wafer 60 and a low-temperature thermal treatment is carried out, for example at 350-450° C. for 30-45 min. Thereby, the metal of the connecting regions 64 of the second wafer 60 react with the silicon of the first wafer 1.

Figure 14:
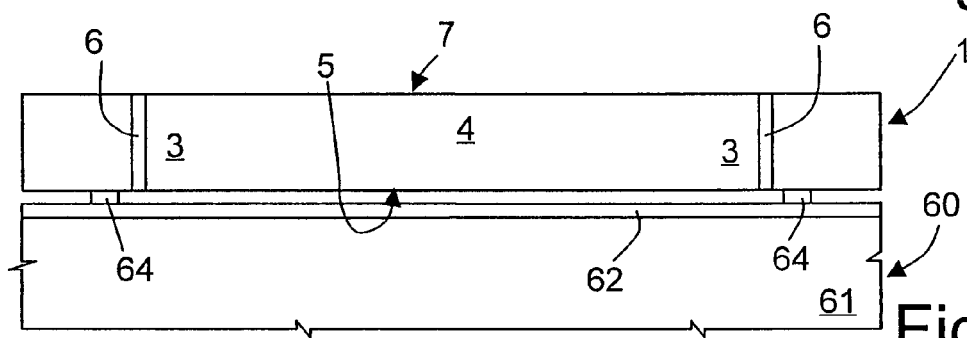

Next, referring to FIG. 14, the first wafer 1 is thinned out from the rear by lapping, until the bottom of the insulating regions 6 is reached, preferably down to 100 μm. The first wafer 1 then presents a second surface 7 opposite to the first surface 5.

Figure 15:
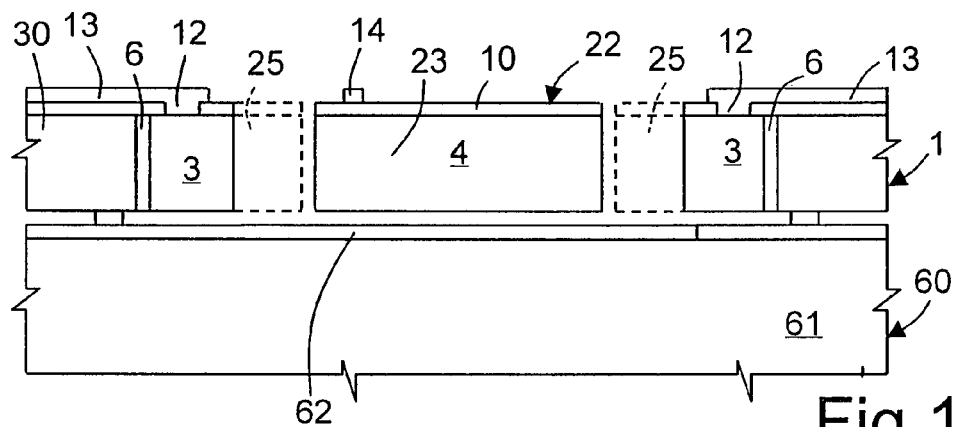

Next, referring to FIG. 15, the second surface 7 is coated with the insulating layer 10, and the connecting regions 12, 13 and 14 are formed thereon. Then, the first wafer 1 undergoes a trench etch, to define the micro-electro-mechanical structure, in this case a micro-actuator 20, as already described above with reference to FIGS. 8 and 10.

Figure 16:
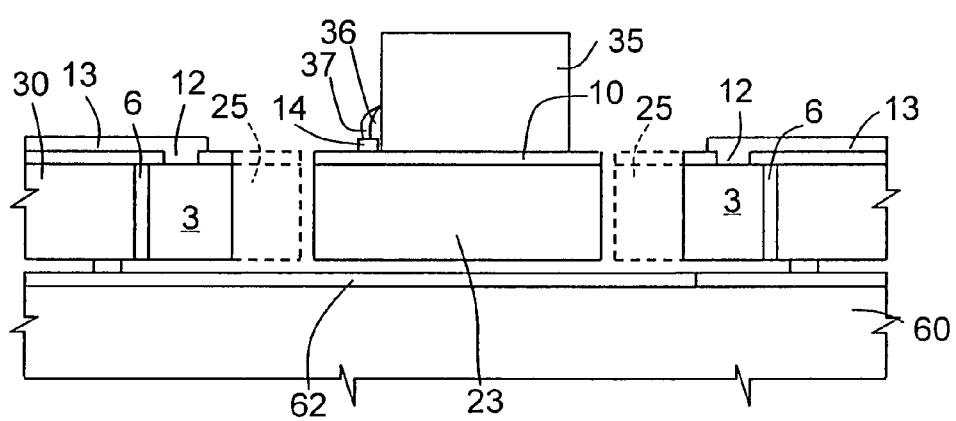

Next, referring to FIG. 16, the second wafer 60 is thinned out, for example by lapping, and then cut into dies using a stick foil. A slider 35 is bonded on the die thus obtained, as already described above with reference to FIG. 9.

Advantages of the microstructure and the process described above include the following. First, the use of junction insulations and separation trenches traversing the entire thickness of the final wafer and the elimination of steps of removing sacrificial layers enable the microstructure to be obtained with a greater thickness than the one previously described. Consequently, the facing area of the mobile and fixed electrodes 24 and 25 is greater than the one that could be obtained hitherto and ensures a greater capacitive coupling between the mobile and fixed electrodes. It follows that the distance between them may be greater than the distance hitherto possible (4-5 μm vs. approximately 2 μm for current actuators).

The greater distance between the electrodes means that any electrostatic particles attracted to the inside of the trench defining the micro-actuator (which typically has a size of 1-2 μm, comparable to the size of defining trenches hitherto achievable and hence smaller than the gap so far obtainable), are less likely to short-circuit the mobile and fixed electrodes or block them.

It follows that the current structure does not require a cap for protection and shielding from the particles, thus drastically reducing the costs of fabrication, as well as the total thickness of the microstructure.

In addition, the greater thickness of the microstructure means that it is sturdier and less subject to failure, so enabling elimination of a supporting wafer (the second wafer 18 operates only as a handling wafer and is removed at the end of the fabrication operations, in the first embodiment) or the use of a supporting wafer of very small thickness (as in the second embodiment).

Referring to FIGS. 10, 11 and 16, floating connections are not necessary for the electrical connection, in so far as all the parts can be reached by metal lines passing on the insulating layer 10. In particular, the connections to the slider 35 can be formed to pass on the springs 31 for supporting the platform 23 and the mobile and fixed parts of the micro-actuator can be biased by usual contacts/connection lines.

The manufacturing process of the microstructure is moreover simplified with respect to known processes and in particular requires fewer masks, with a consequent reduction in the manufacturing costs.

Referring to FIGS. 10 and 16, it is clear that numerous modifications and variations can be made to the microstructures and to the process described and illustrated herein, all falling within the invention, as defined in the attached claims. For example, although the embodiments shown involve the biasing of the fixed regions (fixed electrodes 25) by regions insulated from the bulk, while the mobile regions (platform and mobile electrodes) are electrically connected to the bulk and are at the same potential as the latter, it is possible to make insulated biasing regions at one end of the springs 31, for biasing the mobile regions, and further regions insulated by the insulating regions 6 or other insulating techniques, for biasing the fixed regions (fixed electrodes 25). Alternatively, if the fixed regions are biased at the same potential as the bulk, the insulating regions 6 can be provided only for the biasing regions of the mobile part.

Furthermore, although the illustrated structure has actuating electrodes 24, 25 on two different sides of the platform, it is possible to provide actuating electrodes on just one side thereof.

Embodiments of the invention may moreover also be applied to microstructures of a rotary type, with a circular platform having electrodes extending radially, and to microstructures with different functions, for example sensors and accelerometers.

Referring to FIGS. 8 and 10, in one embodiment, bonding regions 15 can also be provided on the front of the portions of the first wafer 1, which are to be removed (areas between the electrodes 24, 25, where there are sufficient distances) and possibly at the centre of the platform 23, which need not necessarily be "full", but can have holes or cavities, through which it is possible to access the bonding regions 15 for their removal.

Referring to FIG. 10 a micro-actuator 20 according to any of the above-described embodiments may be included in a read/write head assembly, which in turn may be included in a disk drive such as a magnetic hard-disk drive. And such a disk drive may be included in an electronic system such as a computer system.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A process for manufacturing a micro-electro-mechanical device, comprising the steps of:
    forming a body of semiconductor material having a thickness;
    forming, in said body, a mobile part and a fixed part,
    said mobile part comprising a platform, supporting arms extending from said mobile platform to said fixed part, and mobile electrodes fixed to said platform;
    said fixed part comprising fixed electrodes facing said mobile electrodes, at least one first biasing region fixed to said fixed electrodes, and one second biasing region fixed to said supporting arms, and
    forming, in said body, an insulating region of insulating material extending through the entire thickness of said body,
    wherein said insulating region is shaped so as to insulate electrically at least one between said first and second biasing regions from the rest of said fixed part.

2. The process according to claim 1, wherein said step of forming a body comprises providing a substrate of semiconductor material having a thickness greater than said body and thinning out said substrate from the rear, and said step of forming an insulating region comprises, before thinning out said substrate, forming an insulating structure in said substrate extending from a first surface of said substrate down to a depth equal to at least the thickness of said body so that, during said step of thinning out, said insulating structure is reached from behind.

3. The process according to claim 2, wherein said step of forming an insulating structure comprises the steps of:
    making insulating trenches in said substrate; and
    filling, at least partially, said insulating trenches with said insulating material.

4. The process according to claim 2, wherein, before said step of thinning out said substrate, the step of bonding said substrate to a supporting wafer is performed.

5. The process according to claim 4, comprising, before said step of bonding, the steps of:
    forming electrical-connection structures above said first surface;
    forming bonding regions; and
    turning said substrate upside down with said first surface facing said supporting wafer, and
    after said step of thinning out said substrate, the steps of:
    defining said fixed and mobile parts;
    dicing said substrate and removing said supporting wafer.

6. The process according to claim 4, wherein said step of bonding comprises turning said substrate upside down with said first surface facing said supporting wafer,
    said step of thinning out said substrate comprises forming a second surface opposite to said first surface,
    after said step of thinning out said substrate, the step of forming electrical-connection structures above said second surface is performed, and
    after said step of thinning out said substrate, the steps of defining said fixed and mobile parts, thinning out said supporting wafer and dicing said substrate are performed.

7. The process according to claim 1, further comprising the step of bonding to said mobile part a slider for the reading/writing of hard disks.

8. A method for manufacturing of a micro-actuator, comprising:
    forming first trenches in a first wafer;
    filling the first trenches with insulating material;
    attaching a second wafer to a first side of the first wafer for support during manufacturing;
    exposing the trenches through a second side of the first wafer to form a first biasing region and a second biasing region separated by the insulating material; and
    forming second trenches in the first wafer to define fixed electrodes that are integral with the first biasing region and moveable electrodes adjacent to the fixed electrodes and elastically coupled to the second biasing region.

9. The method of claim 8, further comprising:
    coating the first side of the first wafer with an insulating layer; and
    forming contact openings in the insulating layer.

10. The method of claim 9, further comprising:
    forming electrical-connection structures on the insulating layer; and
    forming contact pads in the contact openings.

11. The method of claim 10, further comprising removing the second wafer from the first wafer.

12. The method of claim 10, further comprising:
    forming a platform that is attached to the moveable electrodes; and
    attaching a read/write head to the platform.

13. The method of claim 8 wherein forming the second trenches comprises forming the second trenches such that the fixed electrodes and the moveable electrodes are intertwined.

14. A method for the manufacture of a magnetic hard disk micro-actuator, comprising:
    forming first trenches in a first side of a first wafer;
    filling the first trenches with insulating material;
    attaching a second wafer to the first side of the first wafer to provide a substrate;
    exposing the trenches through a second side of the first wafer to form a first biasing region and a second biasing region separated by the insulating material;
    forming second trenches in the first wafer to define fixed electrodes that are integral with the first biasing region and moveable electrodes adjacent to the fixed electrodes and elastically coupled to the second biasing region.

15. The method of claim 14, further comprising:
    coating the second side of the first wafer with an insulating layer; and
    forming contact openings in the insulating layer.

16. The method of claim 15, further comprising:
    forming electrical-connection structures on the insulating layer: and
    forming contact pads in the contact openings.

17. The method of claim 14, further comprising cutting the first wafer into dies to form fixed electrodes extending from the first biasing region towards a platform wherein the fixed electrodes and the moveable electrodes are intertwined.

18. The method of claim 14, further comprising thinning the second wafer.

19. The method of claim 18 wherein thinning the second wafer further comprises mechanically grinding the second wafer to a thickness of approximately 100 micrometers.

20. The method of claim 18 wherein the fixed electrodes are further than substantially 2 micrometers from the moveable electrodes.

21. The method of claim 14 wherein forming first trenches comprises forming the first trenches in U-shapes.

22. The method of claim 14 wherein attaching a second wafer to the first side of the first wafer further comprises a low temperature thermal treating wherein connecting regions react with the first wafer.

23. The method of claim 22 wherein:
    the connecting regions further comprise gold, and
    the treating further comprises forming a gold/silicon eutectic.

24. The method of claim 22 wherein:
    the connecting regions further comprise palladium, and
    the treating further comprises forming a silicide.

* * * * *